United States Patent [19]
Kobari

[11] Patent Number: 5,010,448
[45] Date of Patent: Apr. 23, 1991

[54] PRINTED CIRCUIT BOARD
[75] Inventor: Tadaomi Kobari, Iwaki, Japan
[73] Assignee: Alpine Electronics Inc., Tokyo, Japan
[21] Appl. No.: 298,527
[22] Filed: Jan. 18, 1989

Related U.S. Application Data

[63] Continuation-in-part of Ser. No. 134,619, Dec. 18, 1987, abandoned, which is a continuation of Ser. No. 900,500, Aug. 26, 1986, abandoned.

[51] Int. Cl.$^5$ .............................. H05K 7/10
[52] U.S. Cl. ................... 361/403; 361/409; 174/261
[58] Field of Search ............ 361/403, 405, 409, 498, 361/404, 406; 174/261, 262, 254; 228/180.1

[56] References Cited

U.S. PATENT DOCUMENTS

| | | | |
|---|---|---|---|
| 2,938,068 | 5/1960 | Silverschotz | 174/268 |
| 3,567,844 | 3/1971 | Krcmar | 174/268 |

FOREIGN PATENT DOCUMENTS 8502751 12/1983 PCT Int'l Appl. .

Primary Examiner—Leo P. Picard
Assistant Examiner—Donald A. Sparks
Attorney, Agent, or Firm—Guy W. Shoup; Brian D. Ogonowsky

[57] ABSTRACT

A printed circuit board has one or more conductor-deleted portions formed in the lands of a conductor pattern printed on an insulating substrate. The conductor-deleted portions may be one or more slits extending radially from a center hole of each land, one or more holes, or one or more notches. Preferably, the conductor-deleted portions are positioned to be in the direction of alignment of the lands. The conductor-deleted portions reduce the amount of solder adhering to the lands and prevent solder bridges between adjacent lands from forming.

11 Claims, 1 Drawing Sheet

PRINTED CIRCUIT BOARD

CROSS-REFERENCE TO RELATED APPLICATION

This application is a continuation-in-part of my co-pending U.S. patent application Ser. No. 134,619, filed Dec. 18, 1987, which is a continuation of U.S. patent application Ser. No. 900,500, filed Aug. 26, 1986, both now abandoned.

BACKGROUND OF THE INVENTION

1. Field of the Invention

The present invention generally relates to a printed circuit board to be used for attaching various kinds of electronic parts, and particularly to a printed circuit board in which the amount of solder deposited on closely spaced printed lands is decreased so as to eliminate the risk of solder bridges.

2. Description of the Prior Art

Conventionally, in order to prevent solder, bridges from occurring, there has been proposed such means as shown in FIG. 6. In FIG. 6, conductor patterns 2 are printed on an insulating substrate 1, a resist 3 is applied thereon to form lands 4, and another resist 5 is applied between adjacent lands 4 having a narrow interval therebetween. Double application of the resists 3 and 5 makes it possible to prevent solder bridges from occurring between the lands 4 when lead wire terminals 7 of electronic parts passed through holes 6 of the respective lands 4 and projected therefrom are connected with the respective lands 4 by soldering.

In such a printed circuit board as described above, while the above-mentioned means acts to prevent the solder bridges, the construction of the circuit board requires additional steps for providing the double resists.

SUMMARY OF THE INVENTION

An object of the present invention is to provide a printed circuit board in which solder bridges can be prevented from occurring without increasing the number of working steps necessary to fabricate the circuit board.

In order to attain the above-mentioned object, the printed circuit board according to the present invention is distinguished in that a portion of each of the lands of a conductive pattern printed on an insulating substrate is deleted. Since each land is formed with a conductor-deleted portion, the bottom area of the molten solder, and, consequently, the height of the solder, can be reduced when soldering is performed by the dipping method. Therefore, the solder, which becomes ball-like owing to surface tension, can not accumulate in height to the point where solder may run off the lands and form a solder bridge between adjacent lands.

By positioning the conductor-deleted portion in line with the direction of the lands, the possibility of solder bridging is further reduced.

DESCRIPTION OF THE PREFERRED EMBODIMENTS

Figure 6:
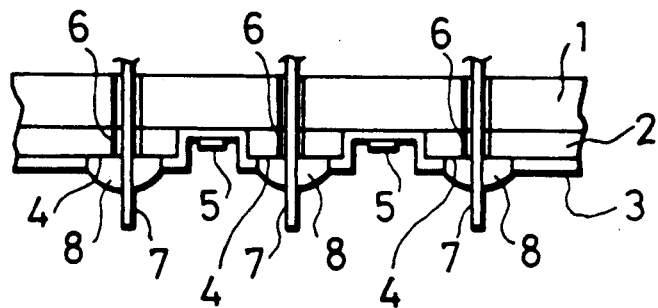
FIG. 6 is a cross-section showing an example of the conventional printed circuit board.

Referring to FIGS. 1 through 5, embodiments of the present invention will be described. In FIGS. 1 through 5, items the same as or equivalent to those in FIG. 6 are correspondingly referenced, and a redundant description is omitted.

Figure 1:
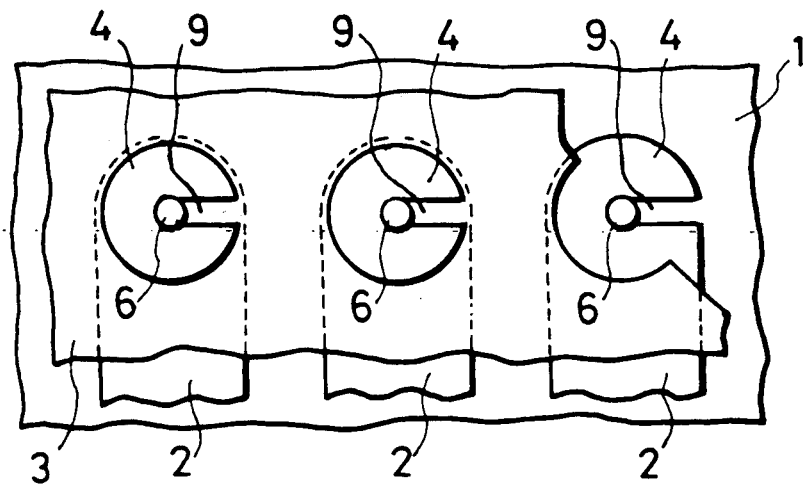
FIG. 1 is a partly cut-away plan view showing an embodiment of the printed circuit board according to the present invention.

In FIG. 1, a conductor pattern 2 is printed on an insulating substrate 1. A resist 3 is applied on the conductor pattern 2, for example, through a screen printing method, so as to form lands 4. A conductor-deleted portion 9 is formed in each of the lands 4 during etching of the conductor pattern 2. Although the conductor deleted portion 9 may, of course, be formed after etching, it is preferable to avoid this method because the number of steps would be increased. The conductor-deleted portion 9 may be a slit extending radially in each of the lands 4 from a center hole 6 formed in the land 4 so that the insulating substrate 1 is partly exposed at the slit.

Each of the slit-shaped conductor-deleted portions 9 is extended in the direction of alignment of the lands 4. The direction and shape of the respective conductor-deleted portions 9 are not limited to the above-mentioned embodiment. Various modifications of conductor-deleted portion 9 are shown in FIGS. 2 through 5.

Figures 2, 3, 4, 5:
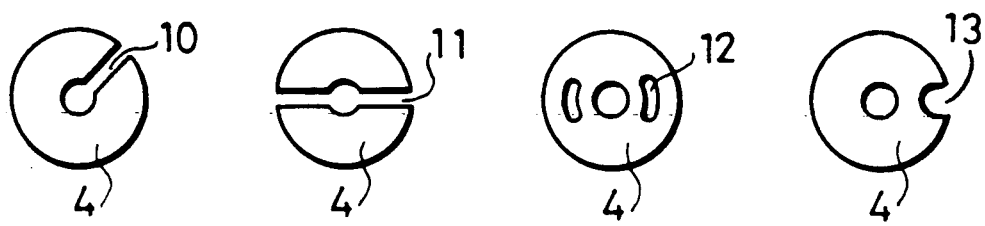
FIGS. 2 through 5 are plan views showing various modifications of the conductor-deleted portion formed in the land.

In the embodiment of FIG. 2, a slit shaped conductor-deleted portion 10 is formed in each land 4 with an angle of about 45 degrees relative to the direction of alignment of the lands.

In the embodiment of FIG. 3, two slit shaped conductor-deleted portions 11 are formed in each land 4 to extend along a diameter passing through a center hole 6 in the direction of alignment of the lands.

In the embodiment of FIG. 4, curved hole conductor-deleted portions 12 are formed in each land 4 and distributed in the direction of alignment of the lands.

In the embodiment of FIG. 5, one or more curved notch conductor-deleted portions 13 are formed at the periphery of each land 4 in the direction of alignment of the lands.

It should be noted that any dimension of the conductor-deleted portions of FIGS. 2-5 would produce the desired result of lowering the height of the solder on the land. Further, the conductor-deleted portions perform their desired function for any size land 4 and center hole 6. Therefore, the inventive conductor-deleted portions will function as desired whether the center hole is of such a small size as to result in bridging of solder across the center hole when no electrical terminal has been inserted therethrough, or, conversely, whether the center hole is so large as to prevent solder from bridging across the center hole when no electrical terminal has been inserted therethrough.

A tradeoff exists, however, between retaining a sufficient conductor area of land 4 which will provide the desired mechanical and electrical properties and forming a conductor-deleted portion of a dimension to adequately reduce the height of solder to prevent solder bridges between adjacent lands.

Sample dimensions for the various embodiments of the invention shown in FIGS. 2-5 will now be given.

In all the embodiments of FIGS. 2-5, a preferred diameter of the lands 4 is between 1.5 mm and 3 mm with center holes 6 having diameters of between 0.7 mm and 1.8 mm or larger.

In the embodiment of FIG. 2, slit-shaped conductordeleted portion 10 has a minimum width merely sufficient to overcome the solder's surface tension and prevent the bridging of solder across slot 10. For a land of approximately 1.5 mm in diameter this minimum width is approximately 0.4 mm.

In the embodiment of FIG. 3, diametrically opposed slit-shaped conductor-deleted portions 11 may, like the embodiment of FIG. 2, have a minimum width of approximately 0.4 mm for a land 4 of diameter 1.5 mm. The diametrically opposed slit-shaped conductor-deleted portions 11 are to be aligned in the direction of the lands to provide double the insurance against solder bridging as is provided by the single slot conductor-delete portion 10 of FIG. 2.

In the embodiment of FIG. 4, curved hole conductor-deleted portions 12 each have a minimum width of approximately 0.3 mm and a minimum arc length of approximately 0.3 mm to prevent bridging of solder across the conductor-deleted portion 12. Curved hole conductor-deleted portions 12 may be circular holes or elongated holes as shown in FIG. 4.

In the embodiment of FIG. 5, curved notch conductor-deleted portion 13 has a minimum width dimension of 0.3 mm and terminates at a maximum distance in from the periphery of land 4 of approximately one-half the radias of land 4.

A plurality of curved notch conductor-deleted portions 13 may be formed around the periphery of land 4 as necessary to reduce the height of the solder.

For soldering, the insulating substrate 1 is dipped in a solder bath with lead wire terminals 7 of electronic parts previously inserted into the center holes 6 of the respective lands 4 having formed therein conductor-deleted portions 9, 10, 11, 12, or 13. As a result, the solder 8 electrically connects the lead terminals 7 with the lands 4 as shown in FIG. 6. Because of the existence of the conductor-deleted portions 9, 10, 11, 12 or 13 in the respective lands 4, the area on each land where the solder 8 adheres is made smaller, and the height of the ball-like solder portion is made lower, so that the foregoing solder bridge phenomenon in which any two adjacent lands 4 are bridged by solder is avoided.

The rising of the solder 8 is made smaller particularly in the area of each land where the conductor-deleted portions 9, 10, 11, 12 or 13 are formed. Therefore, the bridge phenomenon can be further avoided if the conductor-deleted portions are formed to extend in the direction of alignment of the lands as shown in FIGS. 1, 3, 4, and 5.

As described above, according to the present invention, the lands and the corresponding conductor-deleted portions are simultaneously formed on the conductive pattern through only one resist application without using the double resist process. Further, since the height of solder is necessarily reduced as a result of the conductor-deleted portion, the amount of solder used can be reduced, resulting in a reduced cost of the printed circuit board.

I claim:

1. A printed circuit board having a plurality of conductive patterns printed on an insulating substrate, said patterns having a plurality of respective lands, each of said lands being formed by a layer of conductor material, each of said lands having a center hole formed through a center portion of said lands, said substrate having holes therethrough in alignment with each of said center holes in said lands for mounting a respective electrical terminal therethrough, and each of said lands having one or more peripheral holes at peripheral portions of said lands, said substrate being imperforate beneath said peripheral holes, said peripheral holes being solely for the purpose of reducing the area of conductor material on which solder adheres so as to limit the amount of solder adhering to said lands and to prevent the formation of a solder bridge between adjacent lands.

2. The printed circuit board of claim 1 wherein each of said lands has two peripheral holes located so that said center hole is between said two peripheral holes.

3. The printed circuit board of claim 2 wherein each of said peripheral holes have a minimum dimension of 0.3 mm.

4. The printed circuit board of claim 3 wherein said two peripheral holes are positioned so as to be in the direction of alignment of said lands.

5. A printed circuit board having a plurality of conductive patterns printed on an insulating substrate, said patterns having a plurality of respective lands, each of said lands being formed by a layer of conductor material, each of said lands having a circular, nonexpandable center hole formed through a center portion of said land said substrate having a hole therethrough in alignment with said center hole in said land for mounting a respective electrical terminal therethrough, and each of said lands having one or more notches around the periphery of said lands, said substrate being imperforate beneath said peripheral notches, said notches being solely for the purpose of reducing the area of conductor material on which solder adheres so as to limit the amount of solder adhering to said lands and to prevent the formation of a solder bridge between adjacent lands.

6. The printed circuit board of claim 5 wherein said one or more notches comprises one notch.

7. The printed circuit board of claim 6 wherein said notch has a minimum width of 0.3 mm.

8. The printed circuit board of claim 7 wherein said notch is positioned so as to be in the direction of alignment of said lands.

9. The printed circuit board of claim 5 wherein two of said notches are located so that said center hole is between said two notches.

10. The printed circuit board of claim 9 wherein each of said notches has a minimum width of 0.3 mm.

11. The printed circuit board of claim 10 wherein said two notches are positioned so as to be in the direction of alignment of said lands.

* * * * *